(12) United States Patent
Shimizu et al.

(10) Patent No.: US 10,886,703 B1
(45) Date of Patent: Jan. 5, 2021

(54) LED DBR STRUCTURE WITH REDUCED PHOTODEGRADATION

(71) Applicant: Lumileds LLC, San Jose, CA (US)

(72) Inventors: Ken Shimizu, Sunnyvale, CA (US); Hisashi Masui, San Jose, CA (US); Ted Wangensteen, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/455,051

(22) Filed: Jun. 27, 2019

(51) Int. Cl.
*H01S 5/22* (2006.01)
*H01S 5/183* (2006.01)

(52) U.S. Cl.
CPC .......... *H01S 5/222* (2013.01); *H01S 5/18341* (2013.01); *H01S 5/18361* (2013.01); *G02F 2201/346* (2013.01)

(58) Field of Classification Search
CPC .. H01S 5/222; H01S 5/18361; H01S 5/18341; G02F 2201/346
USPC .......................................................... 257/98
See application file for complete search history.

(56) References Cited

U.S. PATENT DOCUMENTS

| 7,901,870 | B1 * | 3/2011 | Wach | G02B 5/285 |
| | | | | 430/321 |
| 2008/0157181 | A1 * | 7/2008 | Kim | H01L 29/42324 |
| | | | | 257/321 |
| 2013/0209780 | A1 * | 8/2013 | Poxson | C23C 14/083 |
| | | | | 428/312.6 |
| 2015/0340567 | A1 | 11/2015 | Ichikawa | |

FOREIGN PATENT DOCUMENTS

WO   2019/027952 A1   2/2019

OTHER PUBLICATIONS

From the EPO as the International Searching Authority, Notification of Transmittal of the International Search Report and the Written Opinion of the ISA corresponding to PCT/US2020/039962 dated Oct. 19, 2020, 14 pages.
Triani, et al., "Atomic Layer Deposition of TiO2/Al2O3 Films for Optical Applications", Proceedings of SPIE, vol. 5870, Aug. 18, 2005, p. 587009.

* cited by examiner

*Primary Examiner* — Vu A Vu

(57) ABSTRACT

A distributed Bragg reflector (DBR) structure on a substrate includes a high refractive index layer comprising titanium oxide (TiO2) and a low refractive index layer having a high carbon region and at least one low carbon region that contacts the high refractive index layer. Multiple layers of the high refractive index layer and the low refractive index layer are stacked. Typically, the multiple layers of the high refractive index layer and the low refractive index layer are stacked to a thickness of less than 10 microns. Each of the respective layers of the high refractive index layer and the low refractive index layer have a thickness of less than 0.2 microns.

16 Claims, 2 Drawing Sheets

US 10,886,703 B1

LED DBR STRUCTURE WITH REDUCED PHOTODEGRADATION

TECHNICAL FIELD

The present disclosure generally relates to manufacture of LED packages with distributed Bragg reflectors (DBR). Atomic layer deposition and a particular set of low carbon precursors are used to improve sidewall thin film quality.

BACKGROUND

Manufacturing LEDs with light reflective sidewalls capable of redirecting light to improve useful light extraction efficiency is common. For example, a sidewall can be coated with various combinations of binder and reflective particles. One often used reflector is based on a silicone binder loaded with TiO2 nanoparticles. Unfortunately, due to particle size and light interaction, such reflective coatings can still result in excess stray light that is absorbed within the coating or redirected into a direction that results in absorption.

Sidewalls can also be coated with reflective metals. While reflectivity can be improved as compared TiO2 nanoparticles, manufacturing difficulties are increased and potential for damage due to the introduction of relatively large amounts of metal into the LED packaging limits widespread use of metal reflectors.

A better reflector is provided by a non-metallic distributed Bragg reflector (DBR). Atomic layer deposition can be used to create multiple layers of precise thickness and of alternating low and high refractive index materials. One common multilayer stack is based on low refractive index alumina ($Al_2O_3$) and high refractive index titanium oxide ($TiO_2$). These layers are compatible with both conventional LED processing temperatures and typical ALD processing temperatures of 180° C. As an additional advantage, various organometallic or halide precursors are usable, including Trimethyl Aluminum for $Al_2O_3$ and $TiCL_4/H_2O$ for $TiO_2$ layer formation.

Unfortunately, amorphous layers of $TiO_2$ created by such ALD processes are photocatalytic. In the presence of blue light generated by an LED and heat, the TiO2 layer can react with carbon contamination from organometallic precursors to create graphite. Over time this leads to significant absorption losses in the LED device. To minimize this damage, non-carbon precursors and low carbon film manufacture techniques to reduce the carbon content are needed.

SUMMARY

In accordance with embodiments of the invention, a DBR structure on a substrate includes a high refractive index layer comprising titanium oxide (TiO2) and a low refractive index layer having a high carbon region and at least one low carbon region that contacts the high refractive index layer. Multiple layers of the high refractive index layer and the low refractive index layer are stacked. Typically, the multiple layers of the high refractive index layer and the low refractive index layer are stacked to a thickness of less than 10 microns. Each of the respective layers of the high refractive index layer and the low refractive index layer can have a thickness of less than 0.2 microns.

In one embodiment, the low refractive index layer includes $Al_2O_3$, which can be formed from an organometallic precursor such as Trimethyl Aluminum. The carbon is precursor results in the high carbon region of the low refractive index layer.

The contacting low carbon region of the low refractive index layer can include $Al_2O_3$ formed from a halide precursor such as $AlCl_3$. Use of a precursor that does not contain carbon results in the low carbon region of the low refractive index layer.

In some embodiments the substrate is sapphire, but it can alternatively be a semiconductor material such as GaN, glass or dielectric structures, or silicon carbide.

In one embodiment, an ALD process for forming a DBR structure on a substrate includes the steps of depositing a first low refractive index layer having a high carbon region; depositing a first low refractive index layer with a low carbon region that contacts the high carbon region; depositing a high refractive index layer comprising titanium oxide ($TiO_2$) that contacts the low carbon region of the first low refractive index layer; depositing a second low refractive index layer with a low carbon region that contacts the high refractive index layer; and depositing a second low refractive index layer having a high carbon region.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
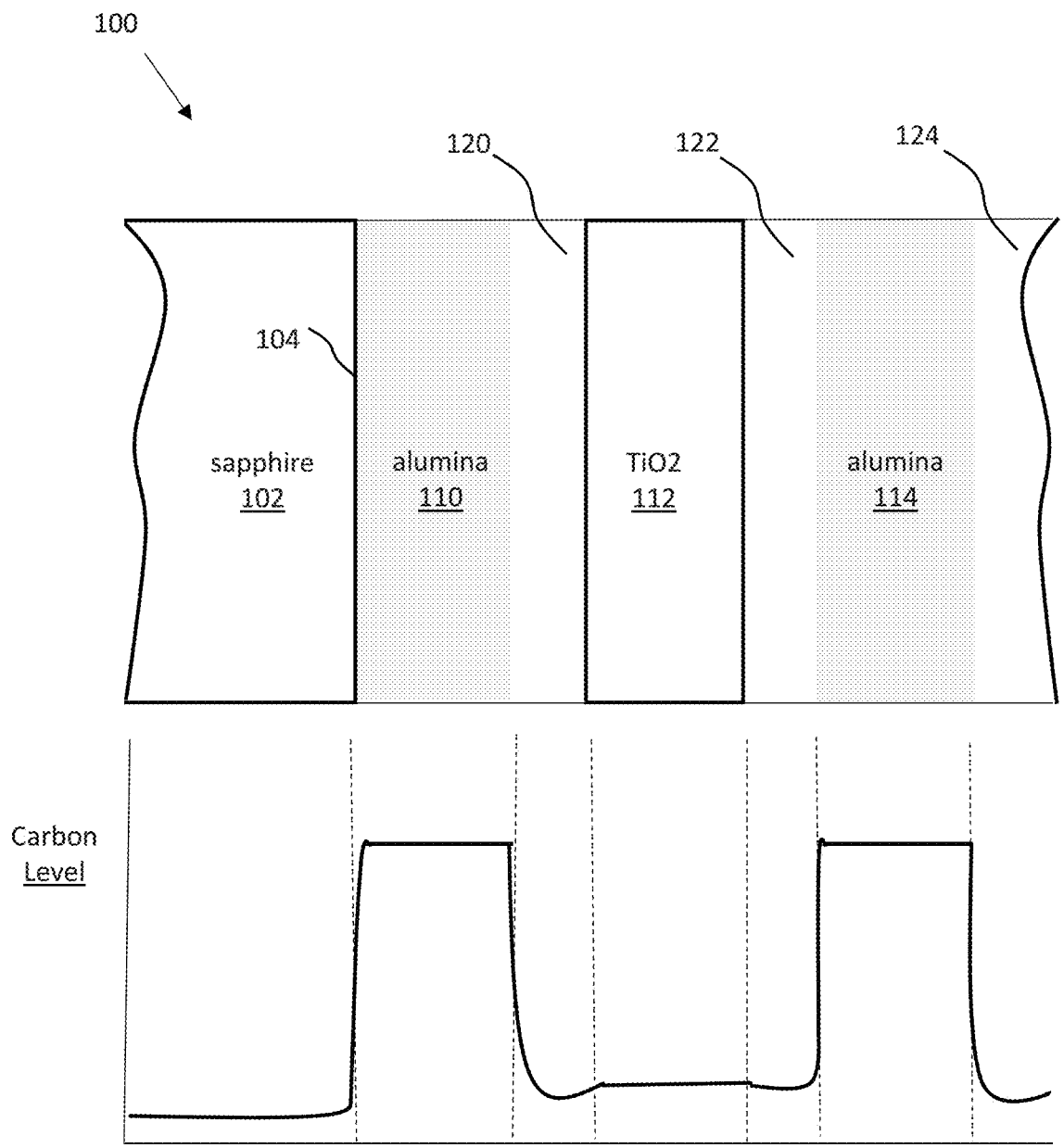
FIG. 1 illustrates one embodiment of a LED substrate sidewall with an attached high reliability distributed Bragg reflector.

FIG. 1 illustrates one embodiment of a LED substrate sidewall 100 with an attached high reliability distributed Bragg reflector. As illustrated, a sapphire substrate 102 has an attached DBR sidewall formed from alternating low and high refractive index layers. Other substrates can also be used, including semiconductor, silicon carbide, glass, or other dielectric substrates that can benefit from attachment of DBR mirrors.

FIG. 1 also shows a first low refractive index layer 110 having a high carbon region attached to sapphire substrate 102. The high carbon region is present because organometallic precursors are used in manufacture. In one embodiment, the low refractive index layer 110 having a high carbon region is alumina ($Al_2O_3$), created using Trimethyl Aluminum as a precursor. Alternatively, $SiO_2$ formed with an organometallic precursor can be used. A first low refractive index layer with a low carbon region 120 contacts the high carbon region of the low refractive index layer 110. In one embodiment, the low refractive index layer with low carbon region 120 can be formed from aluminum halide precursors such as $AlCl_3$. This low refractive index layer with low carbon layer 120 in turn contacts a high refractive index layer 112 comprising titanium oxide ($TiO_2$). A second low refractive index layer with a low carbon region 122 contacts the high refractive index layer 112, followed by a second low refractive index layer having a high carbon region 114 (e.g. another alumina layer), and another low refractive index layer with low carbon layer 124. This pattern of alternating low and high refractive layers (e.g.

$Al_2O_3$ or $SiO_2$ alternating with $TiO_2$) can be repeated multiple times, with carbon mediated degradation being prevented by separating the high carbon low refraction index layers from the high refractive index layers using intermediary low refractive index and low carbon layers. This is illustrated by the associated carbon level graph showing relative carbon amounts in the various described layers.

In some embodiments $TiCl_4$ (or other Ti-halides) and $H_2O$ are precursors for $TiO_2$ layer formation. $AlCl_3$ (or other Al-halides) and $H_2O$ within the $TiO_2$ layer can be used to form thin (1 nm) $Al_2O_3$ with reduced crystallization propensity in the $TiO_2$ layer. Typically, the resultant DBR is a 3~5 um multilayer stack of high ($TiO_2$) and low ($Al_2O_3$) refractive index layers formed using conventional ALD processing. The ALD can be operated at 180° C. and the pulses of $TiCl_4$, $H_2O$ (or Ozone), and $AlCl_3$, $H_2O$ and TMA, $H_2O$ can be sequentially released into the chamber to generate single atomic layers one by one. The LEDs (including substrate, semiconductor die, and phosphor platelets) can be held in place by tape carriers while an ALD chamber is heated to 150~200° C. At these temperatures the $TiO_2$ will crystallize without a substitutional layer of $AlCl_3$ (or other heterogeneous oxide) to form an alloy-like structure an ensuring an amorphous film. Carbon entrapment is eliminated by use of non-carbon precursors for layers deposited near or next to the $TiO_2$ layer.

Figure 2:
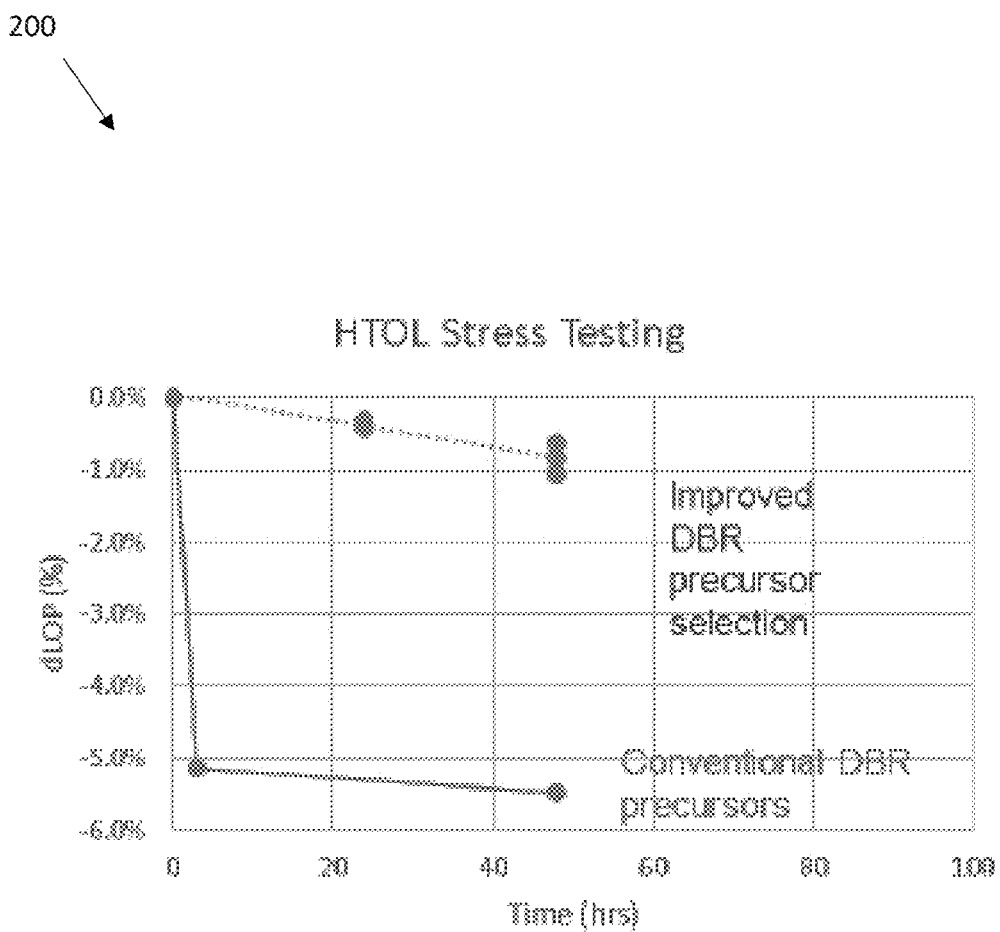
FIG. 2 illustrates improved performance during high temperature operating life (HTOL) testing.

FIG. 2 illustrates improved performance during high temperature operating life (HTOL) testing. As is apparent from the graph, LEDs formed from the improved low carbon DBR precursors have a much lower failure rate than LEDs having sidewalls formed from conventional organometallic DBR precursors.

Light emitting pixel arrays (i.e. addressable LED segments) may particularly benefit from the described low carbon ALD DBR sidewall coatings. As compared to bulky silicone binder and TiO2 nanoparticle sidewalls, ALD DBR sidewalls improve efficiency, greatly reduce between pixel cross talk that can interfere with precise light projection and can be extremely thin (e.g. less than 10 microns), allowing usage in close packed light emitting pixel arrays.

Light emitting pixel arrays with the described improved DBR sidewalls may support applications that benefit from low crosstalk, fine-grained intensity, improved spatial and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays with improved DBR sidewalls include camera flashes, automotive headlights, architectural and area illumination, street lighting, and informational displays.

A light emitting pixel array with improved DBR sidewalls may be well suited for camera flash applications for mobile devices. Typically, an intense brief flash of light from a high intensity LED is used to support image capture. Unfortunately, with conventional LED flashes, much of the light is wasted on illumination of areas that are already well lit or do not otherwise need to be illuminated. Use of a light emitting pixel array may provide controlled illumination of portions of a scene for a determined amount of time. This may allow the camera flash to, for example, illuminate only those areas imaged during rolling shutter capture, provide even lighting that minimizes signal to noise ratios across a captured image and minimizes shadows on or across a person or target subject, and/or provide high contrast lighting that accentuates shadows. If pixels of the light emitting pixel array are spectrally distinct, color temperature of the flash lighting may be dynamically adjusted to provide wanted color tones or warmth.

Automotive headlights that actively illuminate only selected sections of a roadway are also supported by light emitting pixel arrays with improved DBR sidewalls. Using infrared cameras as sensors, light emitting pixel arrays activate only those pixels needed to illuminate the roadway while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Architectural and area illumination may also benefit from light emitting pixel arrays with improved DBR sidewalls. Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays with improved DBR sidewalls. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays with improved DBR sidewalls are also well suited for supporting applications requiring direct or projected displays. For example, warning, emergency, or informational signs may all be displayed or projected using light emitting arrays. This allows, for example, color changing or flashing exit signs to be projected. If a light emitting array with improved DBR sidewalls is composed of a large number of pixels, textual or numerical information may be presented. Directional arrows or similar indicators may also be provided.

Having described the invention in detail, those skilled in the art will appreciate that, given the present disclosure, modifications may be made to the invention without departing from the spirit of the inventive concept described herein.

Therefore, it is not intended that the scope of the invention be limited to the specific embodiments illustrated and described.

The invention claimed is:

1. A DBR structure on a substrate, comprising:
   high refractive index layers each comprising titanium oxide ($TiO_2$); and
   low refractive index layers each having a high carbon region and at least one low carbon region that contacts at least one of the high refractive index layers.

2. The DBR structure of claim 1, wherein the high refractive index layers and the low refractive index layers are stacked to a thickness of less than 10 microns.

3. The DBR structure of claim 1, wherein each of the respective layers of the high refractive index layers and the low refractive index layers have a thickness of less than 0.2 microns.

4. The DBR structure of claim 1, wherein each of the low refractive index layers further comprises at least one of $Al_2O_3$ and $SiO_2$.

5. The DBR structure of claim 1, wherein the high carbon region of the low refractive index layers further comprises $Al_2O_3$ formed from an organometallic precursor.

6. The DBR structure of claim 1, wherein the high carbon region of the low refractive index layers further comprises $Al_2O_3$ formed from Trimethyl Aluminum.

7. The DBR structure of claim 1, wherein the low carbon region of the low refractive index layers further comprises $Al_2O_3$ formed from a halide precursor.

8. The DBR structure of claim 1, wherein the low carbon region of the low refractive index layers further comprises $Al_2O_3$ formed from $AlCl_3$.

9. The DBR structure of claim 1, wherein the substrate is sapphire.

10. An ALD process for forming a DBR structure on a substrate, comprising the steps of:
    depositing a first low refractive index layer having a high carbon region;
    depositing a first low refractive index layer with a low carbon region that contacts the high carbon region;
    depositing a high refractive index layer comprising titanium oxide ($TiO_2$) that contacts the low carbon region of the first low refractive index layer;
    depositing a second low refractive index layer with a low carbon region that contacts the high refractive index layer; and
    depositing a second low refractive index layer having a high carbon region.

11. An ALD process for forming a DBR structure on a substrate of claim 10, wherein the first and second low refractive index layers further comprise $Al_2O_3$.

12. An ALD process for forming a DBR structure on a substrate of claim 10, wherein the high carbon region of the first and second low refractive index layers further comprises $Al_2O_3$ formed from an organometallic precursor.

13. An ALD process for forming a DBR structure on a substrate of claim 10, wherein the high carbon region first and second low refractive index layers further comprises $Al_2O_3$ formed from Trimethyl Aluminum.

14. An ALD process for forming a DBR structure on a substrate of claim 10, wherein the low carbon region of the first and second low refractive index layers further comprises $Al_2O_3$ formed from a halide precursor.

15. An ALD process for forming a DBR structure on a substrate of claim 10, wherein the low carbon region of the first and second low refractive index layers further comprises $Al_2O_3$ formed from $AlCl_3$.

16. An ALD process for forming a DBR structure on a substrate of claim 10, wherein the substrate is sapphire.

* * * * *